United States Patent

Gochi

[11] Patent Number: 5,378,944
[45] Date of Patent: Jan. 3, 1995

[54] IC CARD INPUT/OUTPUT CONTROL CIRCUIT

[75] Inventor: Hidenobu Gochi, Itami, Japan

[73] Assignee: Mitsubishi Denki Kabushiki Kaisha, Tokyo, Japan

[21] Appl. No.: 59,935

[22] Filed: May 11, 1993

[30] Foreign Application Priority Data

May 20, 1992 [JP] Japan .................................. 4-127483

[51] Int. Cl.⁶ .................. H03K 19/0175; H03K 17/16
[52] U.S. Cl. ........................................ 326/62; 365/206;
365/52; 365/189.05; 326/21; 326/105
[58] Field of Search ................ 307/465, 443, 475;
365/206, 52, 189.05

[56] References Cited

U.S. PATENT DOCUMENTS

| | | | |
|---|---|---|---|
| 4,498,022 | 2/1985 | Koyama et al. | 307/473 |
| 4,916,662 | 4/1990 | Mizuta | 365/52 |
| 5,016,223 | 5/1991 | Kimura et al. | 365/52 |
| 5,025,415 | 6/1991 | Masuyama et al. | 365/52 |
| 5,202,852 | 4/1993 | Mizuta | 365/189.05 |
| 5,241,662 | 8/1993 | Maniwa et al. | 395/425 |

Primary Examiner—Edward P. Westin
Assistant Examiner—Richard Roseen
Attorney, Agent, or Firm—Leydig, Voit & Mayer

[57] ABSTRACT

An input/output control circuit for an IC card equipped with one-time programmable read only memory integrated circuits (PROM-ICs) includes a read data bus buffer connected between the one-time PROM-ICs and a data bus; a write data bus buffer connected between the one time PROM-ICs and the data bus; and a selection device for detecting the power supply voltage supplied to the one-time PROM-ICs and selecting one of the read data bus buffer and the write data bus buffer in response to the detected power supply voltage. The input/output control circuit improves the ability of the IC card to withstand electrostatic discharge and prevents the electrical characteristics of an IC card from changing with a change in the number of one-time PROM-ICs mounted thereon.

6 Claims, 3 Drawing Sheets

IC CARD INPUT/OUTPUT CONTROL CIRCUIT

BACKGROUND OF THE INVENTION

1. Field of the Invention

The present invention relates to an input/output control circuit for an IC card equipped with one-time PROM-ICs.

2. Description of the Related Art

FIG. 3 shows a conventional IC card equipped with, one-time PROM-ICs. A card enable signal line 5 is connected to the chip enable signal input terminals CE of a plurality of one-time PROM-ICs 1 through an address decoder 2. An address buffer 3 is connected to each of the one-time PROM-ICs 1 through an internal address bus 7, and an address bus 6 is connected to the address buffer 3. An output enable signal line 10 and a program control signal line 11 are connected to the output enable signal input terminal OE and the program control signal input terminal PGM, respectively, of each of the one-time PROM-ICs 1 through a control signal control circuit 4. Upper address signal lines 8 are connected to the address decoder 2 and the control signal control circuit 4. A data bus 9 and a power supply line 12 are also connected to each of the one-time PROM-ICs 1.

In a data reading operation, an address is supplied to the address bus 6 and the upper address signal lines 8. The card enable signal line 5 and the output enable signal line 10 are brought to L level, and the program control signal line 11 is brought to H level, On the basis of the address specified on the upper address signal lines 8, one of the plurality of PROM-ICs 1 is selected by the address decoder 2 and the control signal control circuit 4, and a chip enable signal at the L level is input to the chip enable signal input terminal of the selected IC 1 from the address decoder 2. At the same time, an output enable signal at the L level and a program control signal at the H level are input to the output enable signal input terminal OE and the program control signal input terminal PGM, respectively, of the selected IC 1 from the control signal control circuit 4. As a result, the selected IC 1 assumes a read state, and the data at the address specified on the address bus 6 is output to the data bus 9.

On the other hand, in a data writing operation, a program voltage Vpp of 12.5 V is supplied to each of the ICs 1 through the power supply 12, an address is given to the address bus 6 and the upper address signal lines 8, and write data is given to the data bus 9. In this state, when the card enable signal line 5 and the program control signal line 11 are brought to the L level, and when the output enable signal line 10 is brought to the H level, a chip enable signal and a program control signal at the L level and the output enable signal at the H level are input to the one-time PROM-IC 1 selected on the basis of the address on the upper address signal lines 8. As a result, the selected IC 1 assumes the write state, and the write data on the data bus 9 is written at the address specified by the address bus 6.

However, as shown in FIG. 3, the conventional IC card equipped with one-time PROM-ICs has no output buffer, and thus has a problem with respect to resisting static electricity. The conventional IC card also has the problem that the output terminal capacity and the electrical properties thereof change with a change in the number of the one-time PROM-ICs mounted thereon.

SUMMARY OF THE INVENTION

The present invention has been achieved for solving the above problems, and an object of the present invention is to provide an IC card input/output control circuit withstanding electrostatic discharge for an IC card and preventing the electrical properties of an IC card from changing with a change in the number of the one-time PROM-ICs mounted thereon.

In accordance with a first aspect of the present invention, there is provided an IC card input/output control circuit comprising a read data bus buffer connected between one-time PROM-ICs and a data bus, a write data buffer connected between the one-time PROM-ICs and the data bus, and selection means for detecting the power supply voltage supplied to the one-time PROM-ICs and selecting one of the read data buffer and the write data buffer on the basis of the power supply voltage detected.

In accordance with a second aspect of the present invention, there is provided an IC card input/output control circuit comprising a read data buffer connected between one-time PROM-ICs and a data bus; a write data buffer connected between the one-time PROM-ICs and the data bus and having a first buffer corresponding to a first write mode and a second buffer corresponding to a second write mode; first selection means for detecting the power supply voltage supplied to the one-time PROM-ICs and selecting one of the read data buffer and the write data buffer on the basis of the power supply voltage detected; and second selection means for selecting one of the first buffer and the second buffer of the write data buffer on the basis of the write mode switching signal for specifying one of the first and second write modes to the one-time PROM-ICs.

In an IC card input/output control circuit according to the first aspect of the invention, the selection means detects the power supply voltage and selects one of the read data buffer and the write data buffer connected between the one-time PROM-ICs and the data bus on the basis of the power supply voltage detected.

In an IC card input/output control circuit according to the second aspect of the invention, the first selection means detects the power supply voltage and selects one of the read data buffer and the write data buffer connected between the one-time PROM-ICs and the data bus on the basis of the power supply voltage detected, and the second selection means selects one of the first and second buffers on the basis of the write mode switching signal.

DESCRIPTION OF THE PREFERRED EMBODIMENTS

Embodiments of the present invention are described below with reference to the drawings.

Figure 1:
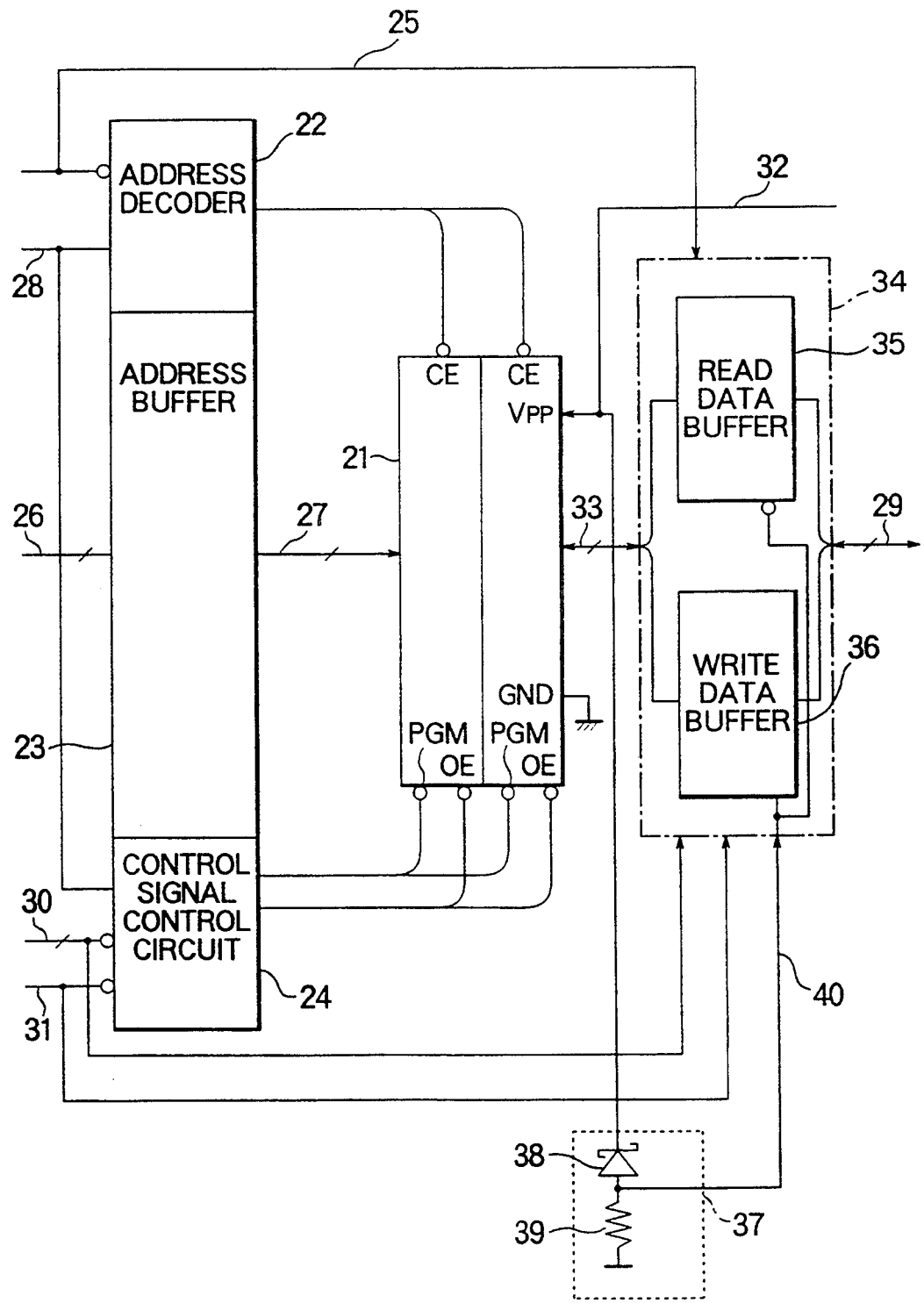
FIG. 1 is a block diagram illustrating an IC card provided with an IC card input/output control circuit in accordance with a first embodiment of the present invention.

In FIG. 1, a card enable signal line 25 is connected to the chip enable signal input terminal CE of each of two one-time PROM-ICs 21 through an address decoder 22. An address buffer 23 is connected to the one-time PROM-ICs 21 through an internal address bus 27, and an address bus 26 is connected to the address buffer 23. An output enable signal line 30 and a program control signal line 31 are connected to the output enable signal input terminal OE and the program control signal input terminal PGM, respectively, of each of the one-time PROM-ICs 21 through a control signal control circuit 24. An upper address signal line 28 is connected to the address decoder 22 and the control signal control circuit 24. A power supply line 32 is also connected to each of the PROM-ICs 21 so as to supply a power supply voltage of 5 V during data reading and a power supply voltage of 12 V or 12.5 V during data writing.

A data bus buffer 34 is connected to each of the one-time PROM-ICs 21 through an internal data bus 33, and an external data bus 29 is connected to the data bus buffer 34. The data bus buffer 34 has a read data bus buffer 35 and a write data bus buffer 36, to both of which a card enable signal line 25, the output enable signal line 30 and the program control signal line 31 are connected.

A power supply voltage detection circuit 37 for detecting a power supply voltage is connected to the power supply line 32, and the output line 40 of the power supply voltage detection circuit 37 is connected to the read data bus buffer 35 and the write data bus buffer 36. The power supply voltage detection circuit 37 comprises a series circuit of a Zener diode 38 and a resistance 39, the output line 40 being led out from the connection point between the Zener diode 38 and the resistance 39. When a power supply voltage of 5 V is supplied through the power supply line 32, the Zener diode 38 assumes a cut-off state, and the output line 40 is thus at the L level. On the other hand, when a power supply voltage of 12 V or 12.5 is supplied, the Zener diode 38 assumes a conductive state, and the output line 40 is thus at the H level. The power supply voltage detection circuit 37 and the output line 40 form selection means.

The operation of the first embodiment is described below.

Tables 1 and 2 show the states of the read data bus buffer 35 and the write data bus buffer 36, respectively, corresponding to the levels of the control signals input to each of the one-time PROM-ICs 21, i.e., the chip enable signal, the output enable signal and the program control signal input to the chip enable signal input terminal CE, the output enable signal input terminal OE and the program control signal input terminal PGM, respectively.

TABLE 1

| CE | OE | PGM | Data Bus Buffer |
|----|----|-----|-----------------|
| H  | x  | x   | high impedance  |
| L  | L  | H   | output          |
| L  | H  | L   | high impedance  |
| L  | H  | H   | high impedance  |
| L  | L  | L   | output          |

TABLE 2

| CE | OE | PGM | Data Bus Buffer |
|----|----|-----|-----------------|
| H  | x  | x   | high impedance  |
| L  | H  | L   | input           |
| L  | H  | H   | input           |
| L  | L  | H   | output          |
| L  | L  | L   | high impedance  |

As obvious from Tables 1 and 2, even if the levels of the control signals are the same, in some cases, the state of the data bus buffer during the reading operation must be different from that during the writing operation. In the first embodiment, the read data bus buffer 35 and the write data bus buffer 36 are thus separately provided so that one of data bus buffers 35 and 36 is selected on the basis of the value of the power supply voltage supplied to the one-time PROMICs 21.

The data reading operation and data writing operation are described in detail below.

In the reading operation, a power supply voltage of 5 V is supplied to each of the ICs 21 through the power supply line 32. The output line 40 of the power supply voltage detection circuit 37 is thus at the L level, and the read data bus buffer 35 is consequently selected. In this case, the buffer state shown in Table 1 is obtained in accordance with the level of each of the control signals.

For example, an address is supplied to the address bus 26 and the upper address signal line 28, the card enable signal line 25 and the output enable signal line 30 are brought to the L level, and the program control signal line 31 is brought into the H level. One of the two PROM-ICs 21 is selected by the address decoder 22 and the control signal control circuit 24 on the basis of the address specified by the upper address signal line 28. The chip enable signal at the L level is input to the chip enable signal input terminal CE of the selected IC 21 from the address decoder 22. At the same time, the output enable signal at the L level and the program control signal at the H level are input to the output enable signal input terminal OE and the program control signal input terminal PGM, respectively, of the selected IC 21 from the control signal control circuit 24. As a result, the selected IC 21 assumes the read state in which the data at the address specified by the address bus 26 is output to the external data bus 29 through the read data bus buffer 35.

On the other hand, in the writing operation, a power supply voltage of 12 V or 12.5 V is supplied to each of the ICs 21 through the power supply line 32. As a result, the output line 40 of the power supply voltage detection circuit 37 is at the H level, and the write data bus buffer 36 is consequently selected. In this case, the buffer state shown in Table 2 is obtained in accordance with the level of each of the control signals.

For example, an address is supplied to the address bus 26 and the upper address signal line 28, and write data is supplied to the external data bus 29. In this state, when the card enable signal line 25 and the program control signal line 31 are brought to the L level, and when the output enable signal line 30 is brought to the H level, the chip enable signal and the program control signal at the L level and the output enable signal at the H level are input to the PROM-IC 21 selected on the basis of the address on the upper address signal line 28. The selected IC 21 thus assumes the write state in which write data on the external data bus 29 is written at the address specified by the address bus 26 through the write data bus buffer 36.

Figure 2:
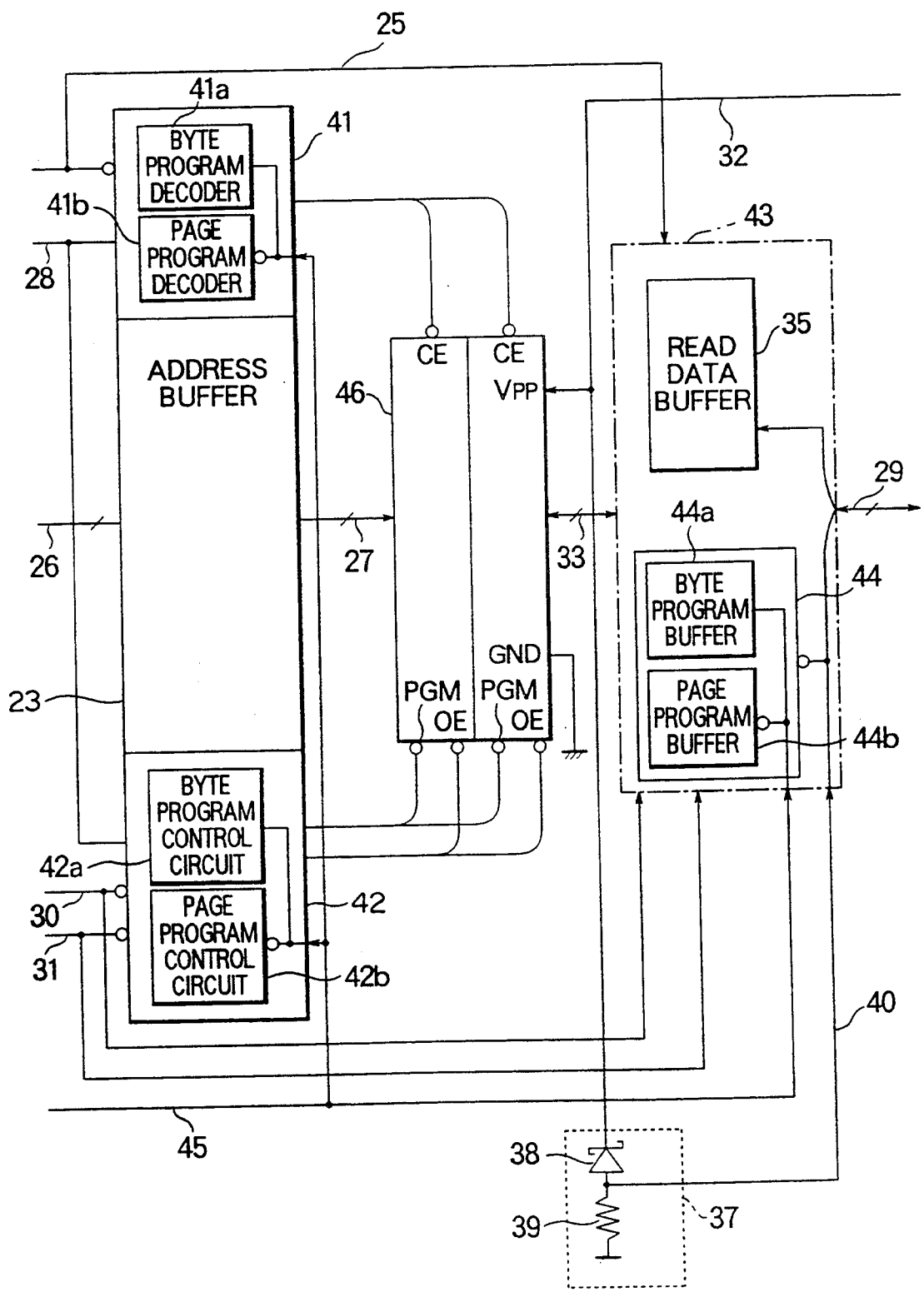
FIG. 2 is a block diagram illustrating an IC card provided with an IC card input/output control circuit in accordance with a second embodiment of the present invention.
Figure 3:
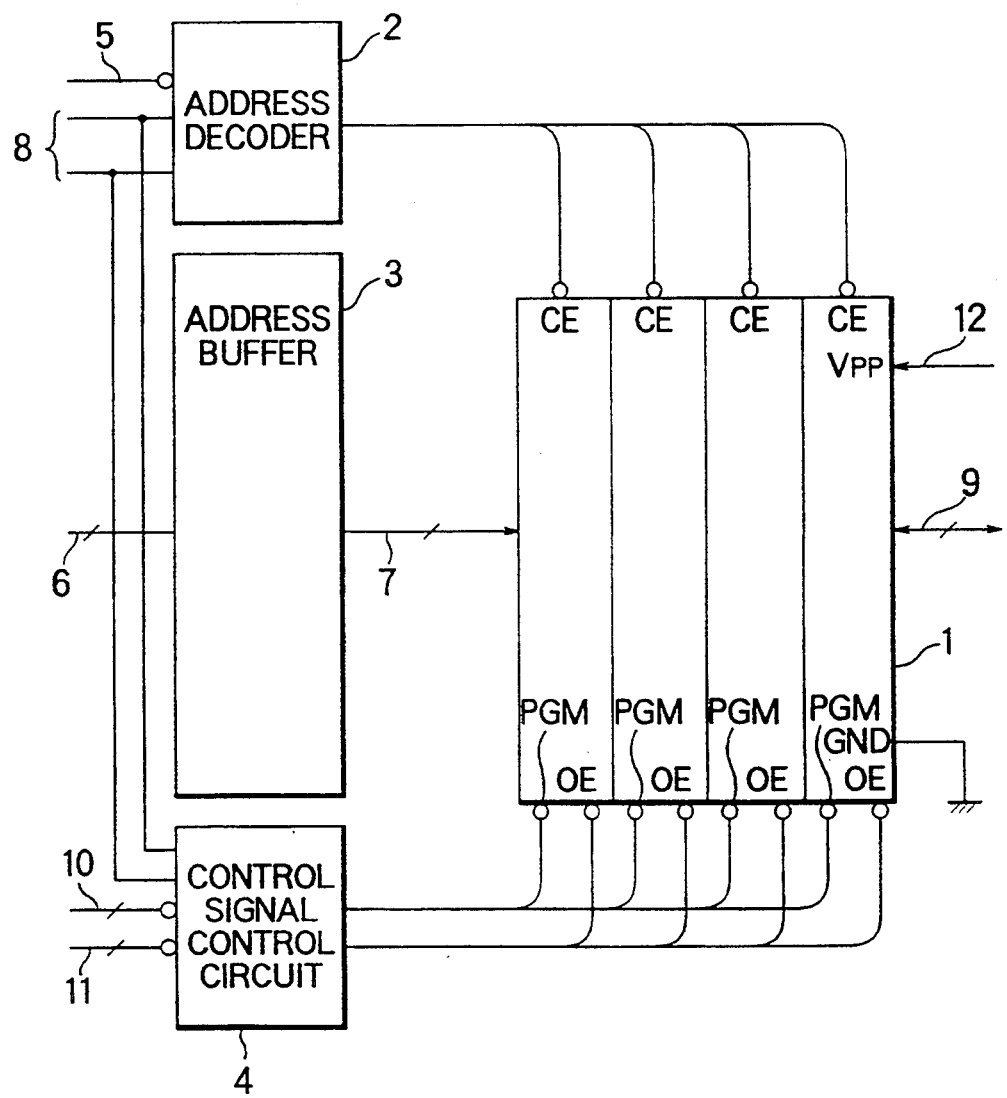
FIG. 3 is a block diagram illustrating a conventional IC card.

FIG. 2 shows the structure of an IC card provided with an IC card input/output control circuit in accordance with a second embodiment. In this IC card, one-time PROM-ICs 46, an address decoder 41, a control signal control circuit 42 and a data bus buffer 43 are provided in place of the one-time PROM-ICs 21, the address decoder 22, the control signal control circuit 24 and the data bus buffer 34 of the IC card shown in FIG. 1, and a write mode switching signal line 45 is connected to the address decoder 41, the control signal control circuit 42 and the data bus buffer 43.

The address decoder 41 includes a byte program decoder 41a and a page program decoder 41b, and the control signal control circuit 42 includes a byte program control circuit 42a and a page program control circuit 42b. The data bus buffer 43 has a read data bus buffer 35 and a write data bus buffer 44 which comprises a byte program buffer 44a and a page program buffer 44b. On the basis of the level of the write mode switching signal input through the write mode switching signal line 45, the byte program decoder 41a, the byte program control circuit 42a and the byte program buffer 44a are selected in a first write mode, i.e., in a byte program, and the page program decoder 41b, the page program control circuit 42b and the page program buffer 44b are selected in a second write mode, i.e., in a page program.

The power supply voltage detection circuit 37 and the outline 40 form first selection means for selecting one of the read data bus buffer 35 and the write data bus buffer 44, and the write mode switching signal line 45 forms second selection means.

The operation of the second embodiment is described below.

In the one-time PROM-IC 46 are set two write modes including the byte program mode and the page program mode. Table 3 shows the state of each of the byte program decoder 41a, the byte program control circuit 42a, and the byte program buffer 44a in correspondence with the levels of the control signals input to the IC card during the byte program.

TABLE 3

| CE | OE | PGM | Decoder 41a | Control circuit 42a | Buffer 44a |
|---|---|---|---|---|---|
| H | x | x | all H | all H | high impedance |
| L | L | H | select | OE:select PGM:all H | output |
| L | H | L | select | OE:all H PGM:select | input |
| L | H | H | select | all H | input |
| L | L | L | select | OE:all H PGM:all H | high impedance |

Similarly, Table 4 shows the state of each of the page program decoder 41b, the page program control circuit 42b, and the page program buffer 44b in correspondence with the control signals input to the IC card during the page program.

TABLE 4

| CE | OE | PGM | Decoder 41b | Control circuit 42b | Buffer 44b |
|---|---|---|---|---|---|
| H | L | H | all H | OE:select PGM:all H | input |
| H | H | H | all H | OE:all H PGM:all H | input |
| H | x | L | all H | OE:all H PGM:select | high impedance |
| L | L | H | select | OE:select PGM:all H | output |
| L | H | H | select | OE:all H PGM:all H | high |

TABLE 4-continued

| CE | OE | PGM | Decoder 41b | Control circuit 42b | Buffer 44b |
|---|---|---|---|---|---|
| L | L | L | select | PGM:all H OE:all H PGM:all H | impedance high impedance |
| L | H | L | select | OE:all H PGM:all H | high impedance |

As obvious from Tables 3 and 4, even if the levels of the control signals are the same, in some cases, the states of the address decoder, the control signal control circuit, and the data bus buffer during the byte program must be different from those during the page program. In the second embodiment, the decoder 41a, control circuit 42a and buffer 44a for the byte program and the decoder 41b, control circuit 42b, and buffer 44b for the page program are thus separately provided so that the circuits for one of the programs are selected on the basis of the write mode switching signal.

In the writing operation, a power supply voltage of 12 V or 12.5 V is supplied to each of the ICs 46 through the power supply line 32. As a result, the output line 40 of the power supply voltage detection circuit 37 is brought into the H level, and the write data bus buffer 44 is consequently selected.

In this state, when the write mode switching signal at the H level is input through the write mode switching signal line 45, the decoder 41a, the control circuit 42a, and the buffer 44a for the byte program are selected. As a result, the state of each of the circuits shown in Table 3 is obtained in accordance with the levels of the control signals. On the other hand, when the write mode switching signal at the L level is input, the decoder 41b, the control circuit 42b and the buffer 44b for the page program are selected. As a result, the state of each of the circuits shown in Table 4 is obtained in accordance with the levels of the control signals.

In the second embodiment, the reading operation is same as that in the first embodiment.

What is claimed is:

1. An input/output control circuit for an IC card equipped with one-time programmable read only memory integrated circuits (PROM-ICs) comprising:
    a read data bus buffer connected between a plurality of one-time PROM-ICs and a data bus;
    a write data bus buffer connected between the one time PROM-ICs and the data bus; and
    selection means for detecting a power supply voltage supplied to the one-time PROM-ICs on a power supply line and selecting one of said read data bus buffer and said write data bus buffer in response to the detected power supply voltage wherein said selection means includes a Zener diode and a resistance connected in series between the power supply line and a ground.

2. The circuit according to claim 1 including an address decoder wherein one of the plurality of PROM-ICs is selected by said address decoder in response to an address signal.

3. An input/output control circuit for an IC card equipped with one-time programmable read only memory integrated circuits (PROM-ICs) having first and second write modes, said circuit comprising:
    a read data bus buffer connected between a plurality of one-time PROM-ICs and a data bus;

a write data bus buffer connected between the one time PROM-ICs and the data bus and having a first buffer corresponding to a first write mode and a second buffer corresponding to a second write mode;

first selection means for detecting a power supply voltage supplied to the one-time PROM-ICs on a power supply line and selecting one of said read data bus buffer and said write data bus buffer in response to the detected power supply voltage; and second selection means for selecting one of said first and second buffers of said write data bus buffer in response to a write mode switching signal specifying one of the first and second write modes to the one-time PROM-ICs.

4. The circuit according to claim 3 wherein said selection means includes a Zener diode and a resistance connected in series between the power supply line and a ground for supplying a power supply voltage to the one-time PROM-ICs.

5. The circuit according to claim 3 including an address decoder wherein one of the plurality of PROM-ICs is selected by said address decoder in response to an address signal.

6. The circuit according to claim 5 wherein said address decoder includes a first address decoder corresponding to a first write mode and a second address decoder corresponding to a second write mode, one of said first and second address decoders being selected in response to a write mode switching signal.

* * * * *